United States Patent
Toyoda

(10) Patent No.: US 7,744,948 B2
(45) Date of Patent: **\*Jun. 29, 2010**

(54) METHOD FOR MANUFACTURING ELECTROLUMINESCENCE DEVICE

(75) Inventor: Naoyuki Toyoda, Suwa (JP)

(73) Assignee: Seiko Epson Corporation (JP)

( * ) Notice: Subject to any disclaimer, the term of this patent is extended or adjusted under 35 U.S.C. 154(b) by 1008 days.

This patent is subject to a terminal disclaimer.

(21) Appl. No.: 11/492,682

(22) Filed: Jul. 25, 2006

(65) Prior Publication Data

US 2007/0026139 A1 Feb. 1, 2007

(30) Foreign Application Priority Data

Jul. 26, 2005 (JP) ............................. 2005-216343

(51) Int. Cl.
  *B05D 5/06* (2006.01)
  *B05D 7/22* (2006.01)
(52) U.S. Cl. .................... 427/66; 427/235; 313/512
(58) Field of Classification Search ............. 427/235, 427/66; 313/512
  See application file for complete search history.

(56) References Cited

U.S. PATENT DOCUMENTS

| | | | | |
|---|---|---|---|---|
| 5,705,888 | A * | 1/1998 | Staring et al. | 313/503 |
| 6,538,375 | B1 * | 3/2003 | Duggal et al. | 313/506 |
| 6,885,144 | B2 | 4/2005 | Matsuo | |
| 6,893,677 | B2 | 5/2005 | Yamada et al. | |
| 2002/0127833 | A1 * | 9/2002 | Izumi et al. | 438/597 |
| 2003/0209973 | A1 * | 11/2003 | McCormick et al. | 313/504 |
| 2005/0073228 | A1 * | 4/2005 | Tyan et al. | 313/110 |

FOREIGN PATENT DOCUMENTS

| | | |
|---|---|---|
| JP | 03-205185 | 9/1991 |
| JP | 11-265785 | 9/1999 |
| JP | 2002-343244 | 11/2002 |
| JP | 2003-142252 | 5/2003 |
| JP | 2003-275653 | 9/2003 |
| JP | 2004-47349 | 2/2004 |
| JP | 2004-103547 | 4/2004 |
| JP | 2004-158815 | 6/2004 |
| JP | 2004-186090 | 7/2004 |
| JP | 2004-291252 | 10/2004 |
| JP | 2005-108643 | 4/2005 |
| JP | 2006-114292 | 4/2006 |

* cited by examiner

*Primary Examiner*—Timothy H Meeks
*Assistant Examiner*—Jimmy Lin
(74) *Attorney, Agent, or Firm*—Harness, Dickey & Pierce, P.L.C.

(57) ABSTRACT

An electroluminescence device includes a tubular first electrode, an electroluminescence layer formed on an inner surface of the first electrode, and a second electrode formed on an inner surface of the electroluminescence layer. A method for manufacturing the electroluminescence device includes: causing the inner surface of the first electrode to be lyophilic with respect to an electroluminescence layer forming liquid; conducting the electroluminescence layer forming liquid into and out of the inside of the first electrode, thereby forming a liquid film of the electroluminescence layer forming liquid on the inner surface of the first electrode, which inner surface is lyophilic with respect to the electroluminescence layer forming liquid; and forming the electroluminescence layer by drying the liquid film of the electroluminescence layer forming liquid formed on the inner surface of the first electrode.

10 Claims, 3 Drawing Sheets

METHOD FOR MANUFACTURING ELECTROLUMINESCENCE DEVICE

CROSS-REFERENCE TO RELATED APPLICATIONS

This application is based upon and claims the benefit of priority from prior Japanese Patent Application No. 2005-216343, filed of Jul. 26, 2005, the entire content of which is incorporated herein by reference.

BACKGROUND

The present invention relates to a method for manufacturing an electroluminescence device.

As typical bar-like light emission devices, fluorescent lights or neon tubes are known. The fluorescent lights and the neon tubes emit light through discharge phenomenon of noble gas sealed in a glass tube. However, the light emission devices that emit light through the discharge phenomenon are difficult to reduce in size and consume a relatively great amount of power. To solve these problems, a bar-like electroluminescence device (hereinafter, referred to simply as an "EL device") having an electroluminescence element (hereinafter, referred to simply as an "EL element") is focused on as a bar-like light emission device that is smaller and decreases power consumption. The EL element is provided on an outer circumferential surface of a bar-like member.

To manufacture the EL device, a wrapping method and a vapor deposition method are known (see, for example, Japanese Laid-Open Patent Publications Nos. 11-265785 and 2005-108643, respectively). In the wrapping method, a first electrode (an anode), an organic layer, and a second electrode (a cathode) are sequentially arranged on a flexible sheet substrate in this order. The sheet substrate is then wound around a support bar. In the vapor deposition method, an organic layer, an anode, and a seal layer are sequentially vapor-deposited on a bar-like cathode in this order.

However, in the wrapping method of Japanese Laid-Open Patent Publication No. 11-265785, the EL element formed on the sheet substrate must be bent when the sheet substrate is wound around the outer circumferential surface of the support bar. If the support bar becomes smaller, excessive compression stress or excessive extension stress acts on each of the layers that form the EL element, which is wound around the support bar. This may deteriorate the electric characteristics of each layer and decrease productivity for manufacturing the EL device.

In the vapor deposition method of Japanese Laid-Open Patent Publication No. 2005-108643, the layers are provided sequentially through deposition with increased directivity. Thus, if a relatively large EL device or a complicatedly configured EL device must be manufactured, formation of an organic layer or a second electrode with uniform thickness becomes difficult. This significantly lowers the productivity for manufacturing the EL device.

SUMMARY

An advantage of some aspects of the present invention is to provide a method for manufacturing an electroluminescence device that facilitates modification of the size or the shape of the electroluminescence device and thus improves productivity for manufacturing the electroluminescence device.

According to an aspect of the present invention, a method for manufacturing an electroluminescence device is provided. The electroluminescence device includes an optically transparent tubular first electrode, an electroluminescence layer formed on an inner surface of the first electrode, and a second electrode formed on an inner surface of the electroluminescence layer. The method includes: causing the inner surface of the first electrode to be lyophilic with respect to an electroluminescence layer forming liquid; conducting the electroluminescence layer forming liquid into and out of the inside of the first electrode, thereby forming a liquid film of the electroluminescence layer forming liquid on the inner surface of the first electrode, which inner surface is lyophilic with respect to the electroluminescence layer forming liquid; and forming the electroluminescence layer by drying the liquid film of the electroluminescence layer forming liquid formed on the inner surface of the first electrode.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EXEMPLARY EMBODIMENTS

Figure 1:
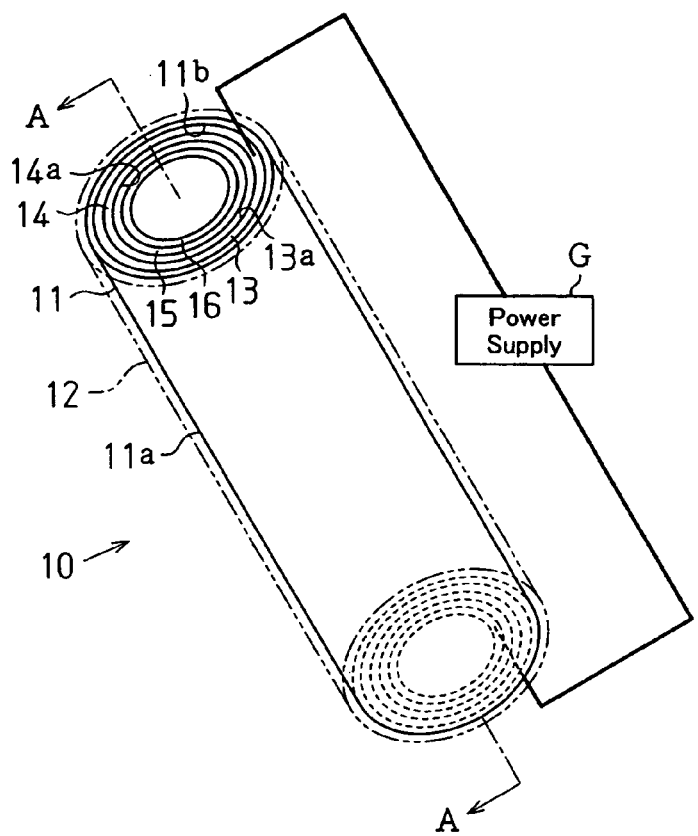
FIG. 1 is a perspective view schematically showing an electroluminescence device according to an embodiment of the present invention.
Figure 2:
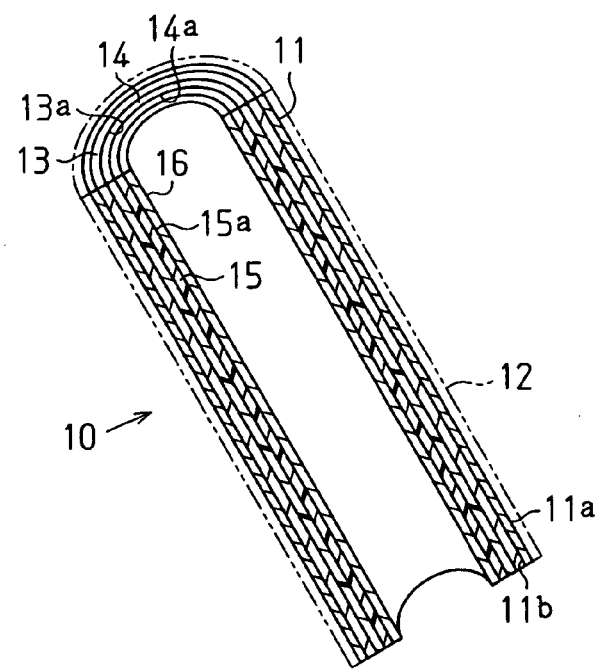
FIG. 2 is a cross-sectional view schematically showing the electroluminescence device.

An embodiment of the present invention will now be described with reference to FIGS. 1 to 8. FIG. 1 is a perspective view schematically showing an electroluminescence device (hereinafter, referred to simply as an "EL device"). FIG. 2 is a cross-sectional view taken along line A-A of FIG. 1.

As shown in FIG. 1, an EL device 10 has a tube 11, or a tubular member. The tube 11 has a circular cross-sectional shape and is formed of optically transparent insulating material. The tube 11 is formed of, for example, inorganic material such as different types of glasses or resin material such as polyethylene terephthalate, polyethylene naphthalate, polypropylene, and polymethylmethacrylate. In the illustrated embodiment, the inner diameter of the tube 11 is approximately 5 mm and the length of the tube 11 is approximately 200 mm. However, the dimensions of the tube 11 are not restricted to these values but may be altered to any other suitable values as long as different liquid films, which will be explained later, can be formed on an inner circumferential surface 11b of the tube 11.

As indicated by the double-dotted broken lines of FIGS. 1 and 2, a seal layer 12 is formed around an outer circumferential surface 11a of the tube 11. The seal layer 12 covers the entire tube 11. The seal layer 12 is formed of an optically transparent inorganic or organic high molecular film having a gas barrier property. The seal layer 12 thus prevents water or oxygen from entering the interior of the tube 11.

An anode layer 13, or a first electrode, is provided on an inner surface (the inner circumferential surface 11b) of the tube 11. The anode layer 13 is an optically transparent anode with uniform thickness provided on the entire inner circumferential surface 11b of the tube 11. The anode layer 13 is formed of conductive material having a relatively great work function (anode layer material: for example, inorganic oxides such as ITO (Indium-Tin-Oxide), $SnO_2$, $SnO_2$ containing Sb, and ZnO containing Al or transparent conductive resin such as polythiophene and polypyrrole). The anode layer 13 is electrically connected to an end of a power supply G that supplies drive power to the EL device 10. The anode layer 13 thus injects holes into a hole transport layer 14, which will be described later.

In the illustrated embodiment, the anode layer 13 is formed by drying and baking the anode layer forming liquid 13L (see FIG. 4), or first electrode forming liquid, in an anode layer forming step as a first electrode forming step, which will be explained later. Specifically, the anode layer forming liquid 13L is formed by dispersing nanoparticles of the aforementioned anode layer material "ITO" in organic hydrophilic dispersion medium. The anode layer forming liquid 13L is conducted into and out of the tube 11 to form an anode layer liquid film 13F (see FIG. 4) on the inner circumferential surface 11b of the tube 11. The anode layer liquid film 13F is then dried to form the anode layer 13.

The hole transport layer 14, which forms an electroluminescence layer (hereinafter, referred to simply as an "EL layer"), is formed on an inner surface (an inner circumferential surface 13a) of the anode layer 13. The hole transport layer 14 is an organic layer with uniform thickness formed on the entire inner circumferential surface 13a of the anode layer 13. In the illustrated embodiment, the thickness of the hole transport layer 14 is not particularly restricted. However, if the thickness of the hole transport layer 14 is excessively small, a pin hole may be caused. If the thickness of the hole transport layer 14 is excessively great, permeability of the hole transport layer 14 may lower and change chromaticity (hue) of the light emitted by a light emitting layer 15, which will be explained later. Therefore, the thickness of the hole transport layer 14 is preferably 10-150 nm, and, more preferably, 50-100 nm. The hole transport layer material that forms the hole transport layer 14 is formed of a conjugated organic compound. Through a property of the material brought about by the presence of electron clouds, the hole transport layer 14 is allowed to transport holes injected by the anode layer 13 to the light emitting layer 15, which will be discussed later.

In the illustrated embodiment, the hole transport layer material is poly(3,4-ethylene dioxythiophene) (hereinafter, referred to simply as "PEDOT"). However, as listed below, the different types of low molecular or high molecular hole transport layer materials may be employed independently or in combination of two or more materials.

The low molecular hole transport layer materials include, for example, benzidine derivatives, triphenylmethane derivatives, phenylenediamine derivatives, styrylamine derivatives, hydrazone derivatives, pyrazoline derivatives, carbazole derivatives, and porphyrin compounds.

The high molecular hole transport layer materials include high molecular compounds containing any of the above-listed low molecular structures (as a main chain or a side chain), polyaniline, polythiophenevinylene, polythiophene, α-naphthylphenyldiamine, mixtures of "PEDOT" and polystyrene sulfonate (Baytron P, trade mark of Bayer Corporation), and different types of dendrimers containing triphenylamine or ethylenediamine as molecular nuclei.

If any of the above-listed low molecular hole transport layer materials is employed, binder (a high molecular binder) may be added to the material as necessary. In this case, it is preferable to select a binder that does not excessively suppress charge transport and exhibits relatively low absorption rate of visible lights. Specifically, as the binder, one or more substances selected from polyethylene oxide, polyvinylidene fluoride, polycarbonate, polyacrylate, polymethyl acrylate, polymethyl methacrylate, polystyrene, polyvinyl chloride, and polysiloxane may be employed independently or in combination. Alternatively, any of the above-listed high molecular hole transport layer materials may be selected as the binder.

In the illustrated embodiment, the hole transport layer 14 is formed by drying hole transport layer forming liquid 14L (see FIG. 6), or electroluminescence layer forming liquid, in a hole transport layer forming step, or an electroluminescence layer forming step. Specifically, the hole transport layer forming liquid 14L is prepared by dissolving the aforementioned hole transport layer material "PEDOT" in water-based solvent (for example, water, lower alcohol such as methanol, or cellosolve solvent such as ethoxyethanol). The hole transport layer forming liquid 14L is conducted into and out of the tube 11 to form a hole transport layer liquid film 14F (see FIG. 6) on the inner circumferential surface 13a of the anode layer 13. The hole transport layer liquid film 14F is then dried to form the hole transport layer 14.

The light emitting layer 15, which forms the EL layer, is arranged on an inner surface (an inner circumferential surface 14a) of the hole transport layer 14. The light emitting layer 15 is an organic layer with uniform thickness formed on the entire inner circumferential surface 14a of the hole transport layer 14. The thickness of the light emitting layer 15 is not restricted to a particular range. However, the thickness of the light emitting layer 15 is preferably 10-150 nm, and, more preferably, to 50-100 nm. If the thickness of the light emitting layer 15 is set in these ranges, holes and electrons efficiently recombine. This further increases light emitting efficiency of the light emitting layer 15. The light emitting layer material that forms the light emitting layer 15 injects holes from the anode layer 13 and electrons from a cathode layer 16, which will be explained later, when voltage is supplied between the anode layer 13 and the cathode layer 16. When the holes and the electrons recombine, the light emitting layer 15 generates excitons (excitation elements) using the energy released through such recombining. When the excitons restore the ground states and release energy, the energy causes emission of fluorescence or phosphorescence (light emission).

In the illustrated embodiment, the light emitting layer material is fluorene-dithiophene copolymer (hereinafter, referred to simply as "F8T2"). However, as listed below, the different types of known low or high molecular light emitting layer materials may be employed independently or in combination of two or more materials.

The low molecular light emitting layer materials include, for example, cyclopentadiene derivatives, tetraphenylbutadiene derivatives, triphenylamine derivatives, oxadiazole derivatives, distyrylbenzene derivatives, thiophene cyclic compounds, pyridine cyclic compounds, perynone derivatives, perylene derivatives, coumarin derivatives, and metal complexes such as aluminum quinolinol complexes, benzoquinolinol beryllium complexes, benzoxazole zinc complexes, benzothiazole zinc complexes, azomethyl zinc complexes, porphyrin zinc complexes, and europium complexes.

The high molecular light emitting layer materials include, for example, polyparaphenylene vinylene derivatives, polyparaphenylene derivatives, polysilane derivatives, polyacetylene derivatives, polythiophene derivatives, polyvinyl carbazole, polyfluorenone derivatives, polyquinoxaline derivatives, polyvinylene styrene derivatives, copolymers formed from these derivatives, and different types of dendrimers including triphenylamine or ethylenediamine as molecular nuclei.

In the illustrated embodiment, the light emitting layer 15 is formed by drying light emitting layer forming liquid 15L (see FIG. 7) in a light emitting layer forming step, or an electroluminescence layer forming step. Specifically, the light emitting layer forming liquid 15L is prepared by dissolving the aforementioned light emitting layer material "F8T2" in non-polar organic solvent (such as benzene, toluene, xylene, cyclohexyl benzene, dihydrobenzofuran, trimethyl benzene, or tetramethyl benzene). The light emitting layer forming liquid 15L is conducted into and out of the tube 11 to form a light emitting layer liquid film 15F (see FIG. 7) on the inner circumferential surface 14a of the hole transport layer 14. The light emitting layer liquid film 15F is then dried to provide the light emitting layer 15. In the illustrated embodiment, the receding contact angle θ3 (see FIG. 7) of the light emitting layer forming liquid 15L is 45 degrees or less with respect to the inner circumferential surface 14a of the hole transport layer 14.

The cathode layer 16, or a second electrode, is formed on an inner surface (an inner circumferential surface 15a) of the light emitting layer 15. The cathode layer 16 is a cathode having uniform thickness provided on the entire inner circumferential surface 15a of the light emitting layer 15. The cathode layer 16 is formed of conductive material with a relatively small work function (metal elementary substances such as Li, Mg, Ca, Sr, La, Ce, Er, Eu, Sc, Y, Yb, Ag, Cu, Al, Cs, and Rb). The cathode layer 16 is electrically connected to the other end of the aforementioned power supply G. The cathode layer 16 thus injects electrons into the light emitting layer 15.

To improve stability of the cathode layer material, the material may be selected as alloy containing two or three elements of the above-described list. If alloy type cathode layer material is employed, it is preferred that alloy containing stable metal elements such as Ag, Al, and Cu, or, more specifically, alloy such as MgAg, AlLi, or CuLi, be selected. These alloys improve electron injection efficiency and stability of the cathode layer 16.

In the illustrated embodiment, the cathode layer 16 is formed by drying cathode layer forming liquid 16L (see FIG. 8) in a cathode layer forming step, which will be explained later. Specifically, the cathode layer forming liquid 16L is prepared by dispersing nanoparticles of silver of the aforementioned cathode layer material in organic dispersion medium. The cathode layer forming liquid 16L is conducted into and out of the tube 11 to form a cathode layer liquid film 16F (see FIG. 8) on the inner circumferential surface 15a of the light emitting layer 15. The cathode layer liquid film 16F is then dried to provide the cathode layer 16. In the illustrated embodiment, the receding contact angle θ4 of the cathode layer forming liquid 16L is 45 degrees or less with respect to the inner circumferential surface 15a of the light emitting layer 15.

When the power supply G is actuated and voltage is supplied between the anode layer 13 and the cathode layer 16, holes move from the anode layer 13 to the light emitting layer 15 through the hole transport layer 14 and electrons move from the cathode layer 16 to the light emitting layer 15. The holes and the electrons thus recombine in the light emitting layer 15, releasing energy. Using the released energy, the light emitting layer 15 generates excitons (excitation elements). The light emitting layer 15 thus emits light through transition of the excitons to the ground state.

A method for manufacturing the EL device 10, which has been described so far, will hereafter be explained with reference to FIGS. 3 to 8.

Figure 3:
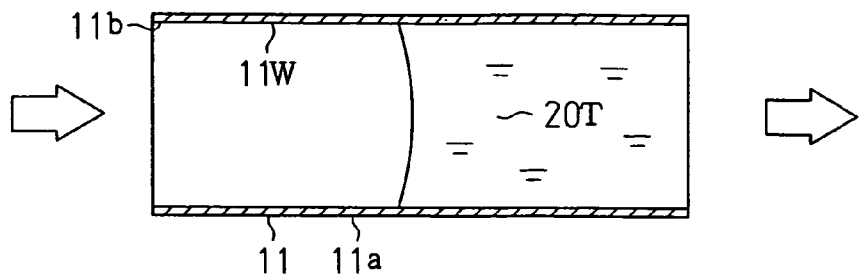
FIGS. 3 to 8 are views for explaining a method for manufacturing the electroluminescence device.

First, as illustrated in FIG. 3, tube lyophilic layer forming liquid 20T, or lyophilic treatment fluid, is conducted into the tube 11 in a direction indicated by the arrows. The tube lyophilic layer forming liquid 20T is thus supplied to the entire inner circumferential surface 11b.

In the illustrated embodiment, the tube lyophilic layer forming liquid 20T is a cleaning liquid formed of a mixture of sulfuric acid and hydrogen peroxide solution. To facilitate formation of the anode layer liquid film 13F, the tube lyophilic layer forming liquid 20T adjusts the receding contact angle θ1 of the anode layer forming liquid 13L to 45 degrees or less with respect to the inner circumferential surface 11b. However, the tube lyophilic layer forming liquid 20T may be changed to at least one selected from a mixture of nitric acid and hydrogen peroxide solution, a mixture of hydrochloric acid and hydrogen peroxide solution, concentrated nitric acid, ozone water, sulfuric acid in which ozone gas is dissolved, nitric acid in which ozone gas is dissolved, hydrochloric acid in which ozone gas is dissolved, aqueous sodium hydroxide, aqueous potassium hydroxide, ethanol solution of sodium hydroxide, and ethanol solution of potassium hydroxide.

Thus, by conducting the tube lyophilic layer forming liquid 20T out of the tube 11, contaminants are washed off from the inner circumferential surface 11b of the tube 11. Further, polar groups such as hydroxyl groups are applied onto the surface of the inner circumferential surface 11b. The inner circumferential surface 11b of the tube 11 thus becomes lyophilic with respect to the anode layer forming liquid 13L. That is, a tube lyophilic layer 11W is provided on the inner circumferential surface 11b of the tube 11.

Figure 4:
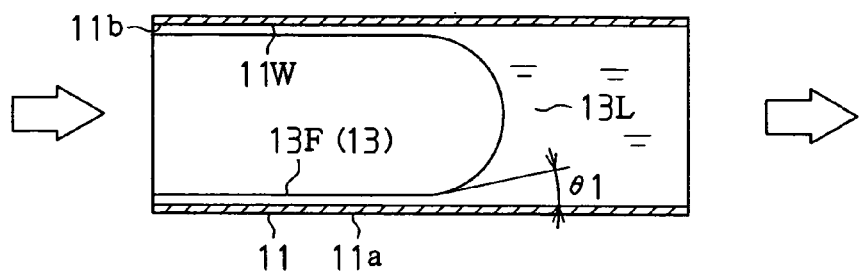

Following the above-described lyophilic treatment step (a second lyophilic treatment step), the anode layer forming step is performed to form the anode layer 13 on the inner circumferential surface 11b (the tube lyophilic layer 11W) of the tube 11. Specifically, as illustrated in FIG. 4, the anode layer forming liquid 13L is conducted into the tube 11 in a direction indicated by the arrows until the tube 11 becomes full. Some of the anode layer forming liquid 13L is then conducted out of the tube 11. This provides the anode layer liquid film 13F formed of the anode layer forming liquid 13L on the entire inner circumferential surface 11b (the tube lyophilic layer 11W) of the tube 11. Since the receding contact angle θ1 of the anode layer forming liquid 13L is adjusted to 45 degrees or less by the tube lyophilic layer 11W, the anode layer liquid film 13F is provided with uniform thickness over substantially the entire inner circumferential surface 11b.

After formation of the anode layer liquid film 13F, the tube 11 is transported to a drying-baking furnace. The tube 11 is thus heated sequentially to a predetermined drying temperature and a predetermined baking temperature, which are set in correspondence with the anode layer forming liquid 13L. The anode layer liquid film 13F is thus dried and baked (dried). In this manner, the anode layer 13 with uniform thickness is formed on the entire inner circumferential surface 11b of the tube 11 in correspondence with modification, if any, to the inner diameter or the length or the shape of the tube 11.

After the anode layer 13 has been provided through conduction of the anode layer forming liquid 13L into and out of the tube 11 and drying and baking of the anode layer liquid film 13F, as has been described, the thickness of the anode layer 13 may be less than a predetermined level. In this case, by prolonging the treatment time or raising the treatment temperature in the lyophilic treatment step, the receding contact angle θ1 may be reduced to increase the thickness of the anode layer liquid film 13F. Contrastingly, if the thickness of the anode layer 13, which has been formed through the conduction of the anode layer forming liquid 13L into and out of the tube 11 and the drying and baking of the anode layer liquid film 13F, exceeds the predetermined level, the treatment time of the lyophilic treatment step may be shortened to increase the receding contact angle θ1, thus decreasing the thickness of the anode layer liquid film 13F.

Figure 5:
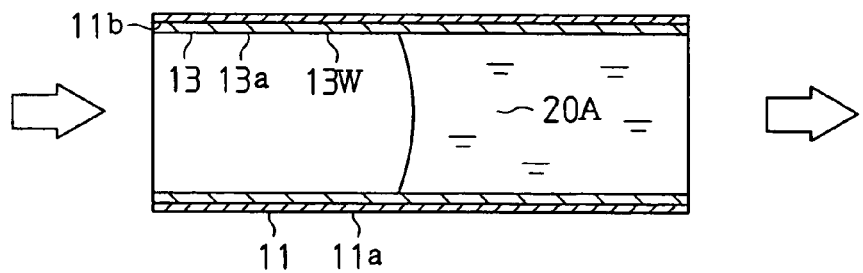

Following the anode layer forming step, a lyophilic treatment step (a first lyophilic treatment step) is performed to provide a lyophilic property to the inner circumferential surface 13a of the anode layer 13. Specifically, as illustrated in FIG. 5, anode lyophilic layer forming liquid 20A, or a lyophilic treatment fluid, is conducted into the tube 11 in a direction indicated by the arrows. The anode lyophilic layer forming liquid 20A is thus supplied to the entire inner circumferential surface 13a of the anode layer 13.

In the illustrated embodiment, the anode lyophilic layer forming liquid 20A is ozone water prepared by dissolving ozone gas in ultrapure water, which is cleaning liquid. To facilitate formation of the hole transport layer liquid film 14F, the anode lyophilic layer forming liquid 20A adjusts the receding contact angle θ2 of the hole transport layer forming liquid 14L to 45 degrees or less with respect to the inner circumferential surface 13a of the anode layer 13. However, the anode lyophilic layer forming liquid 20A may be changed to at least one selected from a mixture of nitric acid and hydrogen peroxide solution, a mixture of hydrochloric acid and hydrogen peroxide solution, concentrated nitric acid, ozone water, sulfuric acid in which ozone gas is dissolved, nitric acid in which ozone gas is dissolved, hydrochloric acid in which ozone gas is dissolved, aqueous sodium hydroxide, aqueous potassium hydroxide, ethanol solution of sodium hydroxide, and ethanol solution of potassium hydroxide.

Thus, by conducting the anode lyophilic layer forming liquid 20A out of the tube 11, the inner circumferential surface 13a of the anode layer 13 is cleansed. Further, polar groups such as hydroxyl groups are applied onto the surface of the inner circumferential surface 13a. The inner circumferential surface 13a of the anode layer 13 thus becomes lyophilic with respect to the hole transport layer forming liquid 14L. That is, an anode lyophilic layer 13W is provided on the inner circumferential surface 13a of the anode layer 13.

Figure 6:
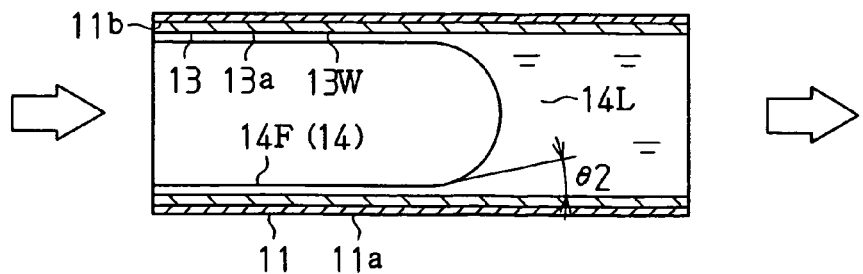

Following the above-described lyophilic treatment step, a hole transport layer forming step is performed to form the hole transport layer 14 on the inner circumferential surface 13a (the anode lyophilic layer 13W) of the anode layer 13. Specifically, as illustrated in FIG. 6, the hole transport layer forming liquid 14L is conducted into the tube 11 in a direction indicated by the arrows until the tube 11 becomes full. Some of the hole transport layer forming liquid 14L is then conducted out of the tube 11. This provides the hole transport layer liquid film 14F formed of the hole transport layer forming liquid 14L on the entire inner circumferential surface 13a (the anode lyophilic layer 13W) of the anode layer 13. Since the receding contact angle θ2 of the hole transport layer forming liquid 14L is adjusted to 45 degrees or less by the anode lyophilic layer 13W, the hole transport layer liquid film 14F is provided with uniform thickness over substantially the entire inner circumferential surface 13a of the anode layer 13.

After formation of the hole transport layer liquid film 14F, the tube 11 is transported to a drying furnace. The tube 11 is thus heated to a predetermined drying temperature, which is set in correspondence with the hole transport layer forming liquid 14L. The hole transport layer liquid film 14F is thus dried to provide the hole transport layer 14 with uniform thickness on the entire inner circumferential surface 13a of the anode layer 13 in correspondence with modification, if any, to the inner diameter or the length or the shape of the tube 11.

After the hole transport layer 14 has been provided through conduction of the hole transport layer forming liquid 14L into and out of the tube 11 and drying of the hole transport layer liquid film 14F, as has been described, the thickness of the hole transport layer 14 may be less than a predetermined level. In this case, by prolonging the treatment time or raising the treatment temperature in the lyophilic treatment step, the receding contact angle θ2 may be decreased to increase the thickness of the hole transport layer liquid film 14F. Contrastingly, if the thickness of the hole transport layer 14, which has been formed through the conduction of the hole transport layer forming liquid 14L into and out of the tube 11 and the drying of the hole transport layer liquid film 14F, exceeds the predetermined level, the treatment time of the lyophilic treatment step may be shortened to increase the receding contact angle θ2. This decreases the thickness of the hole transport layer liquid film 14F.

Figure 7:
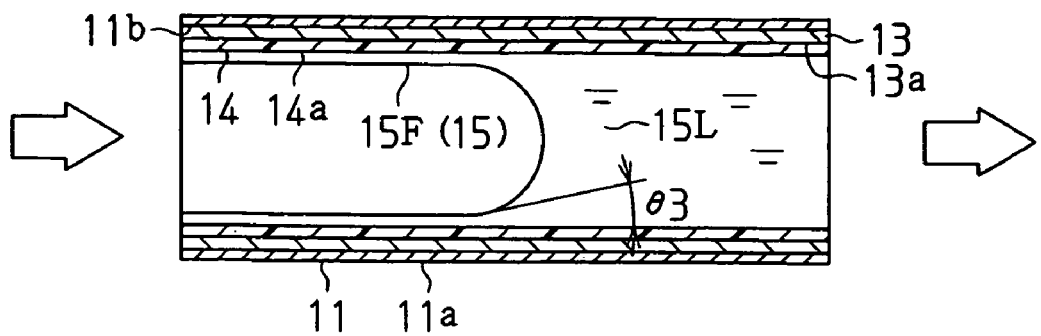

Following the hole transport layer forming step, a light emitting layer forming step is carried out to form the light emitting layer 15 on the inner circumferential surface 14a of the hole transport layer 14. Specifically, as illustrated in FIG. 7, the light emitting layer forming liquid 15L is conducted into the tube 11 in a direction indicated by the arrows, until the tube 11 becomes full. Some of the light emitting layer-forming liquid 15L is then conducted out of the tube 11. This provides the light emitting layer liquid film 15F formed of the light emitting layer forming liquid 15L on the entire inner circumferential surface 14a of the hole transport layer 14. The thickness of the light emitting layer liquid film 15F depends on the receding contact angle θ3 and becomes uniform over substantially the entire inner circumferential surface 14a.

After formation of the light emitting layer liquid film 15F, the tube 11 is transported to a drying furnace. The tube 11 is thus heated to a predetermined drying temperature, which is set in correspondence with the light emitting layer forming liquid 15L. The light emitting layer liquid film 15F is thus dried to provide the light emitting layer 15 with uniform thickness on the entire inner circumferential surface 14a of the hole transport layer 14 in correspondence with modification, if any, to the inner diameter or the length or the shape of the tube 11.

Figure 8:
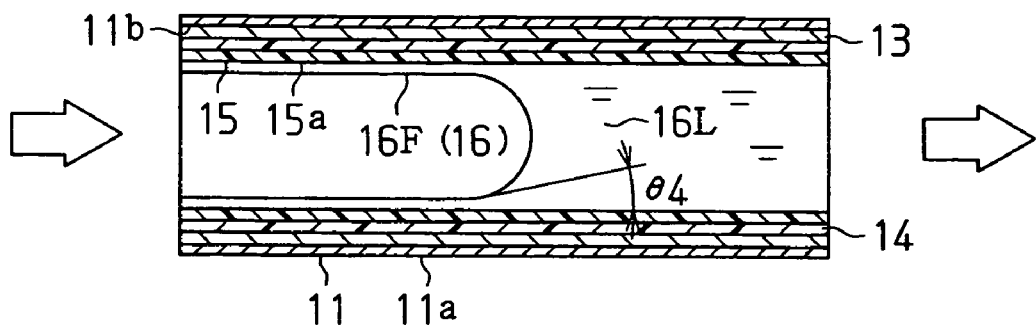

Following the light emitting layer forming step, a cathode layer forming step is performed to form the cathode layer 16 on the inner circumferential surface 15a of the light emitting layer 15. Specifically, as illustrated in FIG. 8, the cathode layer forming liquid 16L is conducted into the tube 11 in a direction indicated by the arrows, until the tube 11 becomes full. Some of the cathode layer forming liquid 16L is then conducted out of the tube 11. This provides the cathode layer liquid film 16F formed of the cathode layer forming liquid 16L on the entire inner circumferential surface 15a of the light emitting layer 15. The thickness of the cathode layer liquid film 16F depends on the receding contact angle θ4 and becomes uniform over substantially the entire inner circumferential surface 15a.

After having formed the cathode layer liquid film 16F, the tube 11 is transported to a drying furnace. The tube 11 is thus heated to a predetermined drying temperature, which is set in correspondence with the cathode layer forming liquid 16L, thus drying the cathode layer liquid film 16F. In this manner, the cathode layer 16 with uniform thickness is formed on the entire inner circumferential surface 15a of the light emitting layer 15 in correspondence with modification, if any, to the inner diameter or the length or the shape of the tube 11.

Following the cathode layer forming step, a seal layer 12, which is formed of an organic or inorganic high molecular film having a gas barrier property, is applied onto and formed on the entire tube 11. At this stage, a portion of the anode layer 13 and a portion of the cathode layer 16 are masked to provide a non-illustrated connection area in each of the masked portions of the anode layer 13 and the cathode layer 16 through which the anode layer 13 or the cathode layer 16 is connected to the power supply G.

In this manner, the anode layer 13, the hole transport layer 14, the light emitting layer 15, and the cathode layer 16 are formed with uniform thicknesses on the entire inner circumferential surface 11b of the tube 11 in correspondence with modification, if any, to the inner diameter or the length or the shape of the tube 11.

The illustrated embodiment has the following advantages.

(1) In the illustrated embodiment, the anode lyophilic layer forming liquid 20A is supplied to the interior of the tube 11 in which the anode layer 13 has been formed. In this manner, the anode lyophilic layer 13W is formed on the entire inner circumferential surface 13a of the anode layer 13. The anode lyophilic layer 13W adjusts the receding contact angle θ2 of the hole transport layer forming liquid 14L to 45 degrees or less. Subsequently, the hole transport layer forming liquid 14L is conducted into and out of the tube 11 in which the anode lyophilic layer 13W has been provided. In this manner, the hole transport layer liquid film 14F is formed on the entire inner circumferential surface 13a of the anode layer 13. The hole transport layer liquid film 14F is then dried to form the hole transport layer 14.

That is, by providing the anode lyophilic layer 13W, the hole transport layer 14 is reliably formed with uniform thickness corresponding to the inner diameter, the length, and the shape of the tube 11. Therefore, the light emitting layer 15 and the cathode layer 16, which are formed over the hole transport layer 14, are provided uniformly and in correspondence with modification, if any, to the size or the shape of the tube 11. This improves productivity for manufacturing the EL device 10.

(2) In the illustrated embodiment, the tube lyophilic layer forming liquid 20T is supplied into the interior of the tube 11 to form the tube lyophilic layer 11W on the entire inner circumferential surface 11b of the tube 11. The tube lyophilic layer 11W adjusts the receding contact angle θ1 of the anode layer forming liquid 13L to 45 degrees or less. Then, the anode layer forming liquid 13L is conducted into and out of the tube 11 in which the tube lyophilic layer 11W has been formed. In this manner, the anode layer liquid film 13F is formed on the entire inner circumferential surface 11b of the tube 11. The anode layer liquid film 13F is then dried to provide the anode layer 13.

That is, by providing the tube lyophilic layer 11W, the anode layer 13 is reliably formed with uniform thickness corresponding to the inner diameter, the length, and the shape of the tube 11. Therefore, the hole transport layer 14, the light emitting layer 15, and the cathode layer 16, which are formed over the anode layer 13, are provided uniformly. This further improves the productivity for manufacturing the EL device 10.

(3) In the illustrated embodiment, each of the tube lyophilic layer forming liquid 20T and the anode lyophilic layer forming liquid 20A is conducted out of the tube 11 after having been supplied to the interior of the tube 11, thus forming the tube lyophilic layer 11W or the anode lyophilic layer 13W. In other words, in formation of each of the tube lyophilic layer 11W and the anode lyophilic layer 13W, organic contaminants are washed off from the inner circumferential surface 11b of the tube 11 or the inner circumferential surface 13a of the anode layer 13. As a result, the anode layer 13 and the hole transport layer 14 become further uniform.

The illustrated embodiment may be modified as follows.

In the illustrated embodiment, the lyophilic treatment step for the tube 11 is performed by conducting the tube lyophilic layer forming liquid 20T into and out of the tube 11. However, after such conduction of the tube lyophilic layer forming liquid 20T, diluted ammonia water or mixture of ammonium hydroxide and hydrogen peroxide solution may be conducted into and out of the tube 11 as cleaning liquid. In this manner, contaminants such as metal are washed off from the inner circumferential surface 11b of the tube 11. The anode layer 13 is thus further uniformly formed.

In the illustrated embodiment, the tube lyophilic layer forming liquid 20T and the anode lyophilic layer forming liquid 20A are each employed as a lyophilic treatment fluid. However, the lyophilic treatment fluid may be ozone gas or gas mixture of ozone gas and vapor.

In the illustrated embodiment, the first lyophilic treatment step and the second lyophilic treatment step are carried out by conducting the tube lyophilic layer forming liquid 20T and the anode lyophilic layer forming liquid 20A, respectively, into and out of the tube 11. However, the tube 11 may be arranged in, for example, the atmosphere containing oxygen. An ultraviolet ray is then radiated onto the inner circumferential surface 11b of the tube 11 or the inner circumferential surface 13a of the anode layer 13, generating ozone gas. The inner circumferential surfaces 11b,13a are thus subjected to a lyophilic treatment by the ozone gas.

In the illustrated embodiment, the tube 11 has a circular cross-sectional shape and a bar-like outline. However, the tube 11 may have an oval or rectangular cross-sectional shape or a spirally curved outline. In other words, the tube 11 may be shaped in any other suitable manner as long as fluid such as the tube lyophilic layer forming liquid 20T or the anode lyophilic layer forming liquid 20A can be conducted into the tube 11.

Although the tube 11 is formed of optically transparent insulating material in the illustrated embodiment, the tube 11 may be formed of optically transparent conductive material, or anode layer material. This makes it unnecessary to separately provide the anode layer 13 on the inner circumferential surface 11b of the tube 11. The step of forming the anode layer can thus be omitted. Further, the productivity for manufacturing the EL device 10 improves.

In the illustrated embodiment, the optically transparent anode layer 13 is formed on the inner circumferential surface 11b of the tube 11. Then, the hole transport layer 14, the light emitting layer 15, and the cathode layer 16 are provided sequentially. However, the optically transparent cathode layer 16 may be formed on the inner circumferential surface 11b of the tube 11. The light emitting layer 15, the hole transport layer 14, and the anode layer 13 are then provided sequentially. In this case, the anode layer 13 may be formed using metal such as gold, platinum, palladium, or nickel or a semiconductor with a relatively great work function such as silicon, gallium-phosphorus, or amorphous silicon carbide. The listed materials may be used independently or in combination of two or more materials as the material of the anode layer 13. Alternatively, the anode layer 13 may be formed of conductive resin material such as polythiophene or polypyrrole.

In the illustrated embodiment, the anode layer forming liquid 13L and the cathode layer forming liquid 16L are conducted into and out of the tube 11, thus forming the anode layer 13 and the cathode layer 16, respectively. However, gaseous anode layer material and gaseous cathode layer material may be supplied into the tube 11 for forming the anode layer 13 and the cathode layer 16, respectively. That is, any other suitable method may be employed as long as the anode layer 13 and the cathode layer 16 are provided substantially on the entire inner circumferential surfaces 11b, 15a, respectively.

In the illustrated embodiment, the light emitting layer material is an organic high molecular material or an organic low molecular material. However, the light emitting layer material may be formed of an inorganic molecular substance such as ZnS/CuCl, ZnS/CuBr, or ZnCdS/CuBr. In this case, it is preferred that the light emitting layer forming liquid 15L be prepared by dispersing the light emitting layer material in organic binder. The organic binder may be a cyanoethylate of polysaccharide such as cyanoethyl cellulose, cyanoethyl starch, or cyanoethyl pullulan or a cyanoethylate of a polysaccharide derivative such as cyanoethyl hydroxyethyl cellulose or cyanoethyl glycerol pullulan or a cyanoethylate of polyol such as cyanoethyl polyvinyl alcohol.

In the illustrated embodiment, the light emitting layer 15 is formed on the inner circumferential surface 11b of the tube 11 as a single layer. However, a multi-photon structure may be employed. Specifically, a plurality of units each including the light emitting layer 15 and a charge generating layer may be provided between the anode layer 13 and the cathode layer 16.

The hole transport layer 14 is formed on the inner circumferential surface 13a of the anode layer 13. However, for example, the hole transport layer 14 may be omitted. Alternatively, a hole injection layer may be arranged between the anode layer 13 and the hole transport layer 14. The hole injection layer improves efficiency for injecting holes into the light emitting layer 15.

In the illustrated embodiment, the light emitting layer 15 is formed on the inner circumferential surface 14a of the hole transport layer 14. However, for example, an electron barrier layer, which suppresses movement of electrons, may be arranged between the hole transport layer 14 and the light emitting layer 15.

In the illustrated embodiment, the cathode layer 16 is formed on the inner circumferential surface 15a of the light emitting layer 15. However, for example, an electron transport layer may be formed between the light emitting layer 15 and the cathode layer 16. The electron transport layer transports the electrons injected from the cathode layer 16 to the light emitting layer 15. Alternatively, a hole barrier layer that suppresses movement of holes may be arranged between the light emitting layer 15 and the electron transport layer.

What is claimed is:

1. A method for manufacturing an electroluminescence device, the electroluminescence device including an optically transparent straight tubular first electrode having a first end and second end, an electroluminescence layer formed on an inner surface of the first electrode, and a second electrode formed on an inner surface of the electroluminescent layer, wherein the first end and the second end have a circular shape, the method comprising:
   causing the inner surface of the first electrode to be lyophilic with respect to an electroluminescence layer forming liquid;
   conducting the electroluminescence layer forming liquid into an inside of the first electrode from the first end to bring the electroluminescence layer forming liquid into contact with the inner surface of the first electrode, and then conducting the electroluminescence layer forming liquid out of the inside of the first electrode from the second end, thereby forming a liquid film of the electroluminescence layer forming liquid on the inner surface of the first electrode, which inner surface is lyophilic with respect to the electroluminescence layer forming liquid; and
   forming the electroluminescence layer by drying the liquid film of the electroluminescence layer forming liquid formed on the inner surface of the first electrode.

2. The method according to claim 1, wherein causing the inner surface of the first electrode to be lyophilic with respect to the electroluminescence layer forming liquid includes conducting a lyophilic treatment fluid into and out of the inside of the first electrode, thereby causing a receding contact angle of the electroluminescence layer forming liquid relative to the inner surface of the first electrode to be 45 degrees or less.

3. The method according to claim 2, wherein the lyophilic treatment fluid is a cleaning liquid for cleaning the inner surface of the first electrode.

4. The method according to claim 3, wherein the cleaning liquid is at least one selected from ozone water, sulfuric acid in which ozone gas is dissolved, nitric acid in which ozone gas is dissolved, hydrochloric acid in which ozone gas is dissolved, a mixture of sulfuric acid and hydrogen peroxide solution, a mixture of nitric acid and hydrogen peroxide solution, a mixture of hydrochloric acid and hydrogen peroxide solution, concentrated nitric acid, aqueous sodium hydroxide, aqueous potassium hydroxide, ethanol solution of sodium hydroxide, and ethanol solution of potassium hydroxide.

5. The method according to claim 1, further comprising:
   causing an inner surface of an optically transparent tubular member to be lyophilic with respect to a first electrode forming liquid;
   conducting the first electrode forming liquid into and out of the inside of the tubular member, thereby forming a liquid film of the first electrode forming liquid on the inner surface of the tubular member, which inner surface is lyophilic with respect to the first electrode forming liquid; and
   forming the first electrode by drying the liquid film of the first electrode forming liquid formed on the inner surface of the tubular member.

6. The method according to claim 5, wherein causing the inner surface of the tubular member to be lyophilic with respect to the first electrode forming liquid includes conducting a lyophilic treatment fluid into and out of the inside of the tubular member, thereby causing a receding contact angle of the first electrode forming liquid relative to the inner surface of the tubular member to be 45 degrees or less.

7. The method according to claim 6, wherein the lyophilic treatment fluid is a cleaning liquid for cleaning the inner surface of the tubular member.

8. The method according to claim 7, wherein the cleaning liquid is at least one selected from ozone water, sulfuric acid in which ozone gas is dissolved, nitric acid in which ozone gas is dissolved, hydrochloric acid in which ozone gas is dissolved, a mixture of sulfuric acid and hydrogen peroxide solution, a mixture of nitric acid and hydrogen peroxide solution, a mixture of hydrochloric acid and hydrogen peroxide solution, concentrated nitric acid, aqueous sodium hydroxide, aqueous potassium hydroxide, ethanol solution of sodium hydroxide, and ethanol solution of potassium hydroxide.

9. The method according to claim 1, wherein the electroluminescence layer includes a hole transport layer formed on the inner surface of the first electrode, and a light emitting layer formed on the inner surface of the hole transport layer, the forming of the electroluminescence layer including:

conducting a hole transport layer forming liquid into and out of the inside of the first electrode, thereby forming a liquid film of the hole transport layer forming liquid on the inner surface of the first electrode, which inner surface is lyophilic with respect to the electroluminescence layer forming liquid;

forming the hole transport layer by drying the liquid film of the hole transport layer forming liquid formed on the inner surface of the first electrode;

conducting a light emitting layer forming liquid into and out of the inside of the obtained hole transport layer, thereby forming a liquid film of the light emitting layer forming liquid on the inner surface of the hole transport layer; and forming the light emitting layer by drying the liquid film of the light emitting layer forming liquid formed on the inner surface of the hole transport layer.

10. The method according to claim 1, wherein the electroluminescence layer includes a light emitting layer formed on the inner surface of the first electrode, and a hole transport layer formed on the inner surface of the light emitting layer, the forming of the electroluminescence layer including:

conducting a light emitting layer forming liquid into and out of the inside of the first electrode, thereby forming a liquid film of the light emitting layer forming liquid on the inner surface of the first electrode, which inner surface is lyophilic with respect to the electroluminescence layer forming liquid;

forming the light emitting layer by drying the liquid film of the light emitting layer forming liquid formed on the inner surface of the first electrode;

conducting a hole transport layer forming liquid into and out of the inside of the obtained light emitting layer, thereby forming a liquid film of the hole transport layer forming liquid on the inner surface of the light emitting layer; and forming the hole transmit layer by drying the liquid film of the hole transport layer forming liquid formed on the inner surface of the light emitting layer.

* * * * *